(12) United States Patent
Kuo et al.

(10) Patent No.: US 9,293,334 B2
(45) Date of Patent: Mar. 22, 2016

(54) N METAL FOR FINFET AND METHODS OF FORMING

(71) Applicant: Taiwan Semiconductor Manufacturing Company, Ltd., Hsin-Chu (TW)

(72) Inventors: Po-Chin Kuo, Hsin-Chu (TW); Chung-Liang Cheng, Changhua County (TW); Hsien-Ming Lee, Changhua (TW); Weng Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/669,786

(22) Filed: Mar. 26, 2015

(65) Prior Publication Data

US 2015/0200100 A1    Jul. 16, 2015

Related U.S. Application Data

(62) Division of application No. 13/720,732, filed on Dec. 19, 2012.

(51) Int. Cl.
| | |
|---|---|
| *H01L 29/49* | (2006.01) |
| *H01L 21/28* | (2006.01) |
| *H01L 29/78* | (2006.01) |
| *H01L 21/02* | (2006.01) |

(52) U.S. Cl.
CPC ........ *H01L 21/28194* (2013.01); *H01L 21/022* (2013.01); *H01L 21/02194* (2013.01); *H01L 21/02205* (2013.01); *H01L 21/28088* (2013.01); *H01L 21/28185* (2013.01); *H01L 29/4966* (2013.01); *H01L 29/785* (2013.01)

(58) Field of Classification Search
CPC ................ H01L 29/4966; H01L 29/66545; H01L 21/28088; H01L 29/517
USPC .................. 257/369, 413; 438/664
See application file for complete search history.

(56) References Cited

U.S. PATENT DOCUMENTS 7,381,608 B2 *  6/2008  Brask ................ H01L 21/28079
                                                       257/E21.202
7,521,775 B2     4/2009  Doyle et al.
(Continued)

FOREIGN PATENT DOCUMENTS

| KR | 1020120021444 | 3/2012 |
|---|---|---|
| WO | 2011139642 | 11/2011 |

OTHER PUBLICATIONS

Korean Office Action and English Translation, Patent Application No. 10-2013-0020546, Apr. 1, 2014, 9 pages.
(Continued)

*Primary Examiner* — Bradley K Smith
*Assistant Examiner* — David Goodwin
(74) *Attorney, Agent, or Firm* — Slater & Matsil, L.L.P.

(57) ABSTRACT

An N work function metal for a gate stack of a field effect transistor (FinFET) and method of forming the same are provided. An embodiment FinFET includes a fin supported by a semiconductor substrate, the fin extending between a source and a drain and having a channel region, and a gate stack formed over the channel region of the fin, the gate stack including an N work function metal layer comprising an oxidation layer on opposing sides of a tantalum aluminide carbide (TaAlC) layer.

20 Claims, 8 Drawing Sheets

(56) References Cited

U.S. PATENT DOCUMENTS

| | | | |
|---|---|---|---|
| 8,120,117 B2* | 2/2012 | Tsuchiya | 257/369 |
| 8,362,573 B2* | 1/2013 | Wu et al. | 257/401 |
| 8,513,740 B2* | 8/2013 | Park et al. | 257/369 |
| 2002/0000598 A1 | 1/2002 | Kang et al. | |
| 2009/0315093 A1 | 12/2009 | Li et al. | |
| 2011/0108928 A1 | 5/2011 | Tao et al. | |
| 2011/0263115 A1 | 10/2011 | Ganguli et al. | |
| 2011/0298062 A1* | 12/2011 | Ganguli et al. | 257/410 |
| 2012/0007166 A1* | 1/2012 | Zhu et al. | 257/319 |
| 2013/0126979 A1* | 5/2013 | Chern et al. | 257/379 |
| 2013/0161762 A1* | 6/2013 | Kelly et al. | 257/401 |
| 2013/0217220 A1* | 8/2013 | Jagannathan et al. | 438/592 |
| 2013/0249010 A1* | 9/2013 | Ng et al. | 257/369 |
| 2013/0264617 A1 | 10/2013 | Joshi et al. | |
| 2013/0277748 A1 | 10/2013 | Lee et al. | |

OTHER PUBLICATIONS

Sterkel, M., et al., "Complementary Tunneling-Transistors (TFET): Fabrication and Application down to the 65 nm CMOS-node," SINANO Workshop: Nanoscale CMOS and emerging post-CMOS logic and memory nanodevices, Sep. 16, 2005, 27 pages.

* cited by examiner

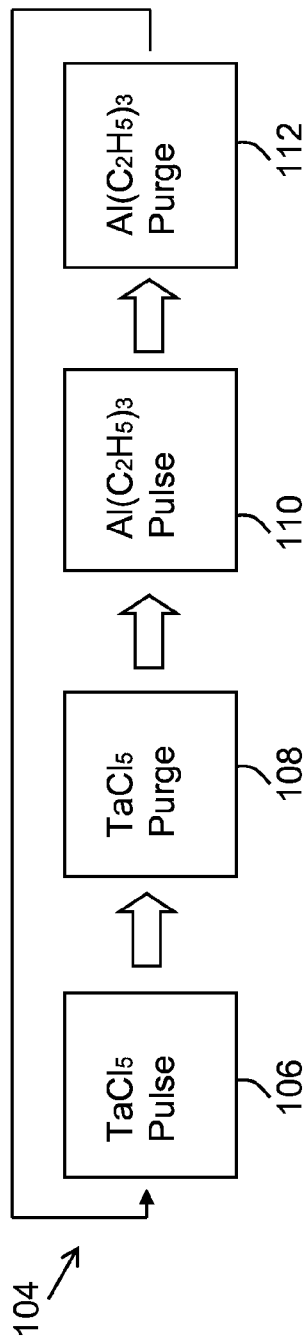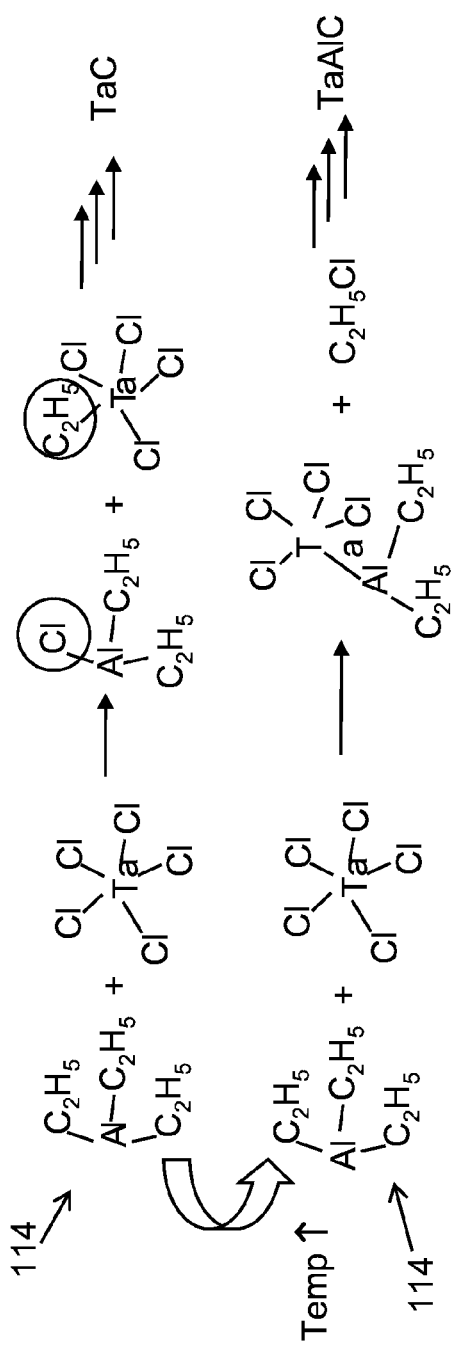
Fig. 5
Fig. 6

122

TaAlC Composition

| TEMP (C) | Condition | O1s (%) | Al2p (%) | Cl2p (%) | Ta4f (%) | C1s (%) |
|---|---|---|---|---|---|---|
| 375 | 10-10 | 41.8 | 16.8 | 1.6 | 15.5 | 24.5 |
| 400 | 10-10 | 41.9 | 18.5 | 1.0 | 13.9 | 24.7 |
| 425 | 15-7 | 42.5 | 18.8 | 1.1 | 13.7 | 24.0 |
| 425 | 10-10 | 46.2 | 19.3 | 0.9 | 11.9 | 21.7 |
| 450 | 10-10 | 47.5 | 20.1 | 0.6 | 10.9 | 20.9 |
|   |   |   | Al% |   | Ta% | C% |

N METAL FOR FINFET AND METHODS OF FORMING

This divisional application claims priority to U.S. patent application Ser. No. 13/720,732, filed on Dec. 19, 2012, entitled "N Metal For FINFET," which application is hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors are used in sub 32 nm transistor nodes. Fin-FETs not only improve areal density, but also improve gate control of the channel.

In order to set the threshold voltage ($V_t$) for a FinFET, a work function (WF) metal is included in the gate stack. Because the gate stack of the FinFET is formed over both the top and sidewalls of the channel, a conformal process is needed to form the gate stack. Unfortunately, the physical vapor deposition (PVD) process typically used to form the N work function metal (e.g., titanium aluminide, TiAl) for a planar device is not suitable for formation of the gate stack in the FinFET. Indeed, the physical vapor deposition is not conformal.

BRIEF DESCRIPTION OF THE DRAWINGS

For a more complete understanding of the present disclosure, and the advantages thereof, reference is now made to the following descriptions taken in conjunction with the accompanying drawing, in which:

FIG. 5 illustrates a repeating process of pulsing and purging to form monolayers of the tantalum aluminide carbide (TaAlC) layer in the N work function metal layer in the gate stack of the FinFET of FIG. 1;

FIG. 6 illustrates two reaction models illustrating the effect of temperature in forming the tantalum aluminide carbide (TaAlC) layer in the N work function metal layer in the gate stack of the FinFET of FIG. 1;

FIG. 10 is a chart depicting various parameters used for the aluminide carbide (TaAlC) layer composition.

FIG. 10 is a chart depicting a work function tuning matrix.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to preferred embodiments in a specific context, namely a Fin-FET metal oxide semiconductor (MOS). The invention may also be applied, however, to other integrated circuits, electronic structures, and the like.

Figure 1:
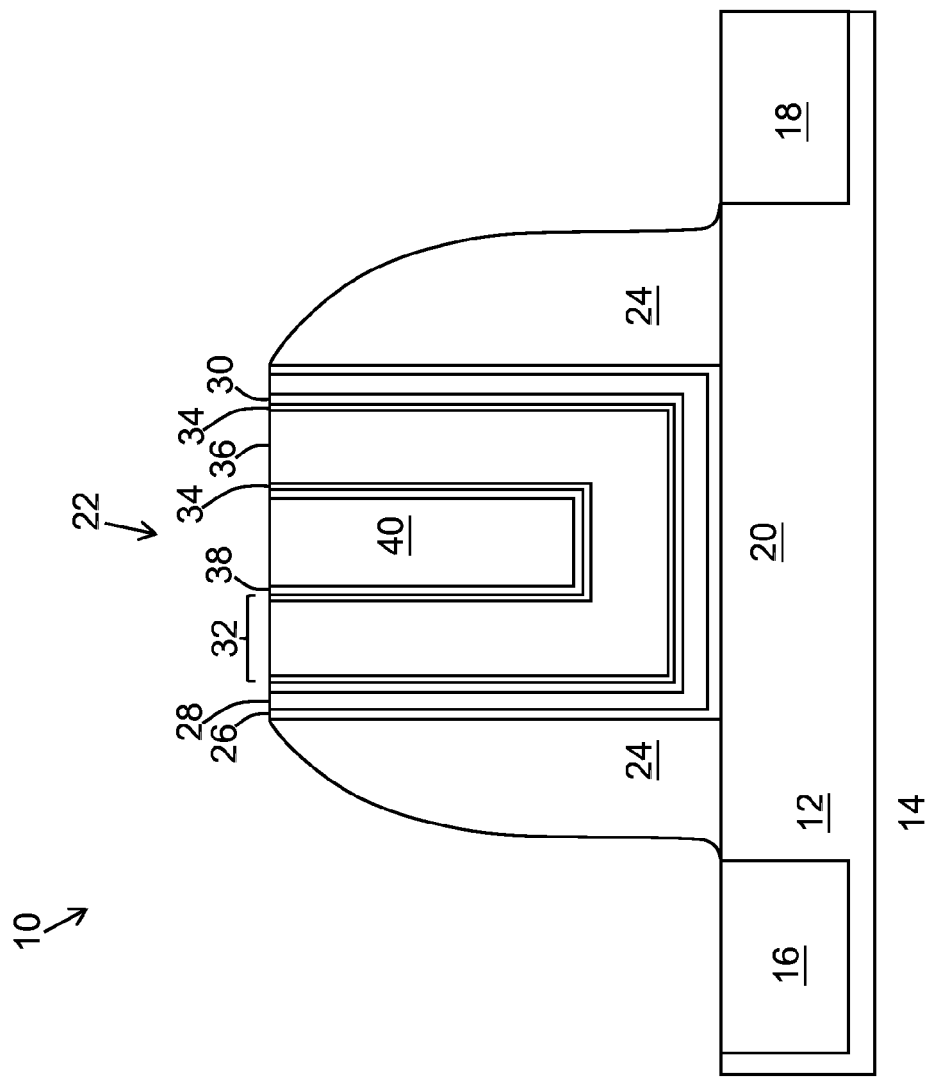
FIG. 1 illustrates an embodiment FinFET having a gate stack with an N work function metal layer including an oxidation layer on opposing sides of a tantalum aluminide carbide (TaAlC) layer.

Referring now to FIG. 1, an embodiment FinFET 10 is illustrated. As shown, the embodiment FinFET 10 includes a fin 12 formed from or on a semiconductor substrate 14. In an embodiment, the semiconductor substrate 14 can be recessed to form the fin 12. In an embodiment, the fin 12 can be epitaxially-grown on the semiconductor substrate 14. In an embodiment, the fin 12 and the semiconductor substrate 14 are formed from silicon, germanium, silicon germanium, or another suitable semiconductor material.

As shown in FIG. 1, the fin 12 extends between a source 16 and a drain 18 and defines a channel region 20 beneath a gate stack 22. In other words, the gate stack 22 is disposed over the channel region 20 of the fin 12. In an embodiment, spacers 24 are supported by the fin 12 and disposed adjacent to the gate stack 22. In addition, other integrated circuit structures (e.g., contact plugs to the source 16 and the drain 18, an interlevel dielectric (ILD) adjacent the spacers 24, etc.) may be formed in or on the FinFET 10.

Still referring to FIG. 1, the gate stack 22 includes several layers. In an embodiment, the gate stack 22 includes a gate dielectric layer 26. As shown, the gate dielectric layer 26 is disposed over the fin 12 above the channel region 20. In addition, the gate dielectric layer 26 is disposed along sidewalls of the spacers 24. In an embodiment, the gate dielectric layer 26 is formed from an interfacial dielectric and a high-k dielectric (IL/HK). In an embodiment, the high-k dielectric portion of the gate dielectric layer 26 has a thickness of about 15 Angstroms to about 25 Angstroms. Even so, in other embodiments the gate dielectric layer 26 and the high-k dielectric portion of the gate dielectric layer 26 may have other suitable thicknesses.

In an embodiment, a high-k dielectric cap layer 28 is disposed over the gate dielectric layer 26. The high-k dielectric cap layer 28 may be formed from a suitable high-k dielectric material such as, for example, titanium nitride (TiN). In an embodiment, the high-k dielectric cap layer 28 has a thickness of between about 10 Angstroms and about 20 Angstroms. Even so, in other embodiments the high-k dielectric cap layer 28 may have other suitable thicknesses.

Still referring to FIG. 1, a barrier/etch stop layer (ESL) 30 is disposed over the high-k dielectric cap layer 28. The barrier/etch stop layer 30 may be formed from a suitable barrier or etch stop material such as, for example, tantalum nitride (TaN). In an embodiment, the barrier/etch stop layer 30 has a thickness of about 10 Angstroms to about 20 Angstroms. Even so, in other embodiments the barrier/etch stop layer 30 may have other suitable thicknesses.

As shown in FIG. 1, an N work function metal layer 32 is disposed over the barrier/etch stop layer 30. In an embodiment, the N work function metal layer 32 includes an oxidation layer 34 on opposing sides of a tantalum aluminide carbide (TaAlC) layer 36. In other words, thin oxidation layers 34 are observed on the surface of the tantalum aluminide carbide layer 36 at the interface of the barrier/etch stop layer 30 and the N work function metal layer 32 (e.g., TaAlC—TaN interface) and at the interface of a glue metal layer 38 and the N work function metal layer (e.g., TaAlC—TiN interface). As such, in an embodiment the barrier/etch stop layer (ESL) 30 engages with the oxidation layer 34 on an exterior side of the tantalum aluminide carbide layer 36.

In an embodiment, the N work function metal layer 32 includes about 16% to about 25% aluminum (Al), about 20% to about 29% carbon (C), about 7% to about 16% tantalum (Ta), and about 35% to about 50% oxygen (O). In an embodiment, the ratio of Al/C is about 0.5 to about 1.3, the ratio of Ta/C is about 0.2 to about 0.8, and the ratio of Al/Ta is about 1 to about 3.6. In an embodiment, a thickness of the N work function metal layer 32 is between about 30 to about 90 Angstroms. Even so, in other embodiments the N work function metal layer 32 may have other suitable thicknesses. As will be more fully explained below, the tantalum aluminide carbide (TaAlC), which may be referred to as a metal carbide film, gives the FinFET 10 of FIG. 1 a tunable work function to meet device needs.

Still referring to FIG. 1, the glue metal layer 38 is disposed over the N work function metal layer 32. As such, the glue metal layer 38 engages with the oxidation layer 34 on an interior side of the tantalum aluminide carbide layer 36. The glue metal layer 38 may be formed from a suitable glue material such as, for example, titanium nitride (TiN). In an embodiment, the glue metal layer 38 has a thickness of about 10 Angstroms to about 30 Angstroms. Even so, in other embodiments the glue metal layer 38 may have other suitable thicknesses. As shown in FIG. 1, a metal fill layer 40 is disposed over the glue metal layer 38. The metal fill layer 40 may be formed from a suitable metal such as, for example, tungsten (W).

Figure 2:
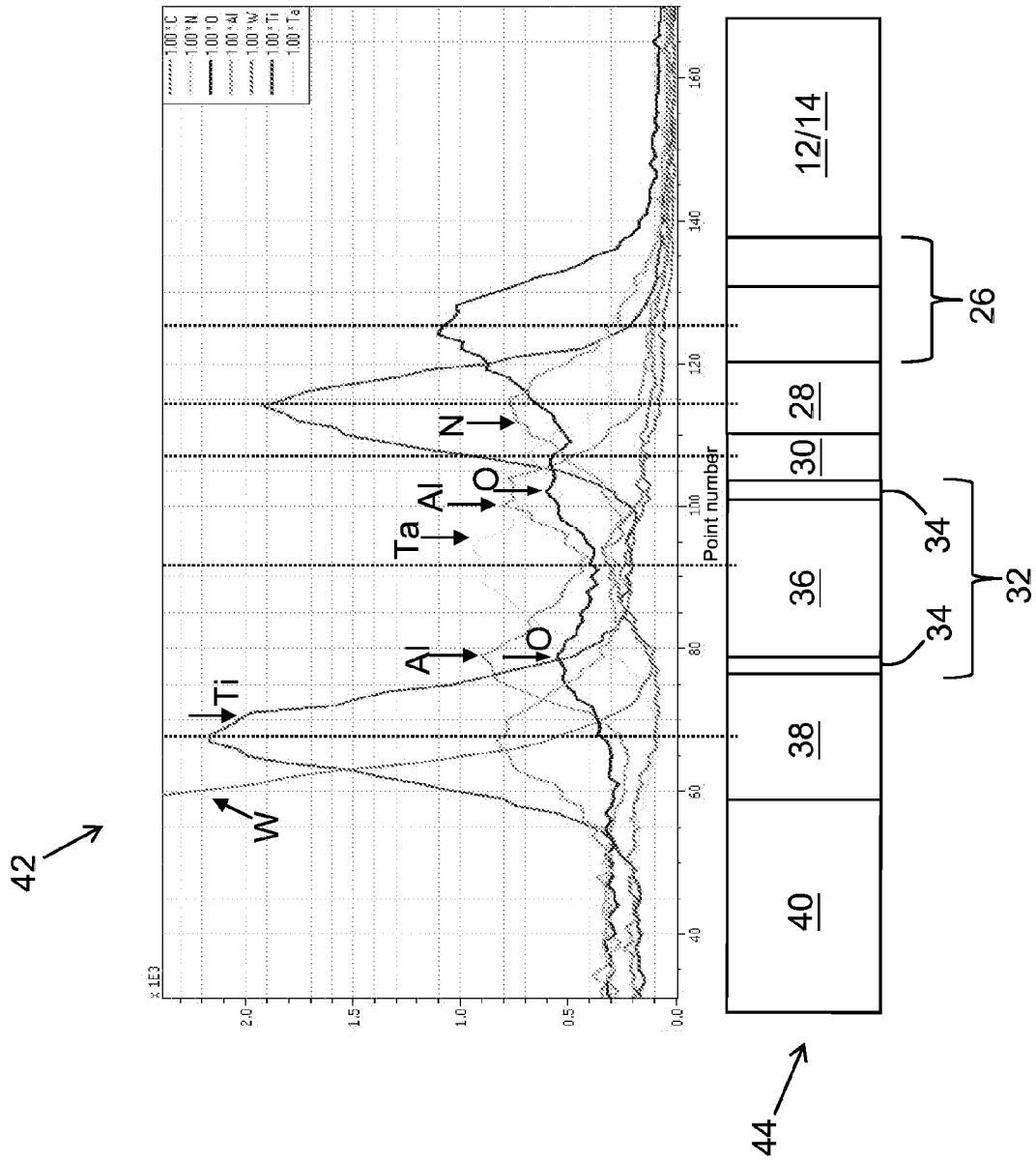
FIG. 2 illustrates a line scan energy-dispersive x-ray spectrometry (EDS) graph for a representative slice of the gate stack of FIG. 1.

Referring now to FIG. 2, a line scan energy-dispersive x-ray spectrometry (EDS) graph 42 is disposed over a representative slice 44 of the gate stack 22 of FIG. 1. As the graph 42 of FIG. 2 illustrates, the oxidation layers 34 on opposing sides of the tantalum aluminide carbide (TaAlC) layer 36 are aluminum (Al) and oxygen (O) rich.

Figure 3:
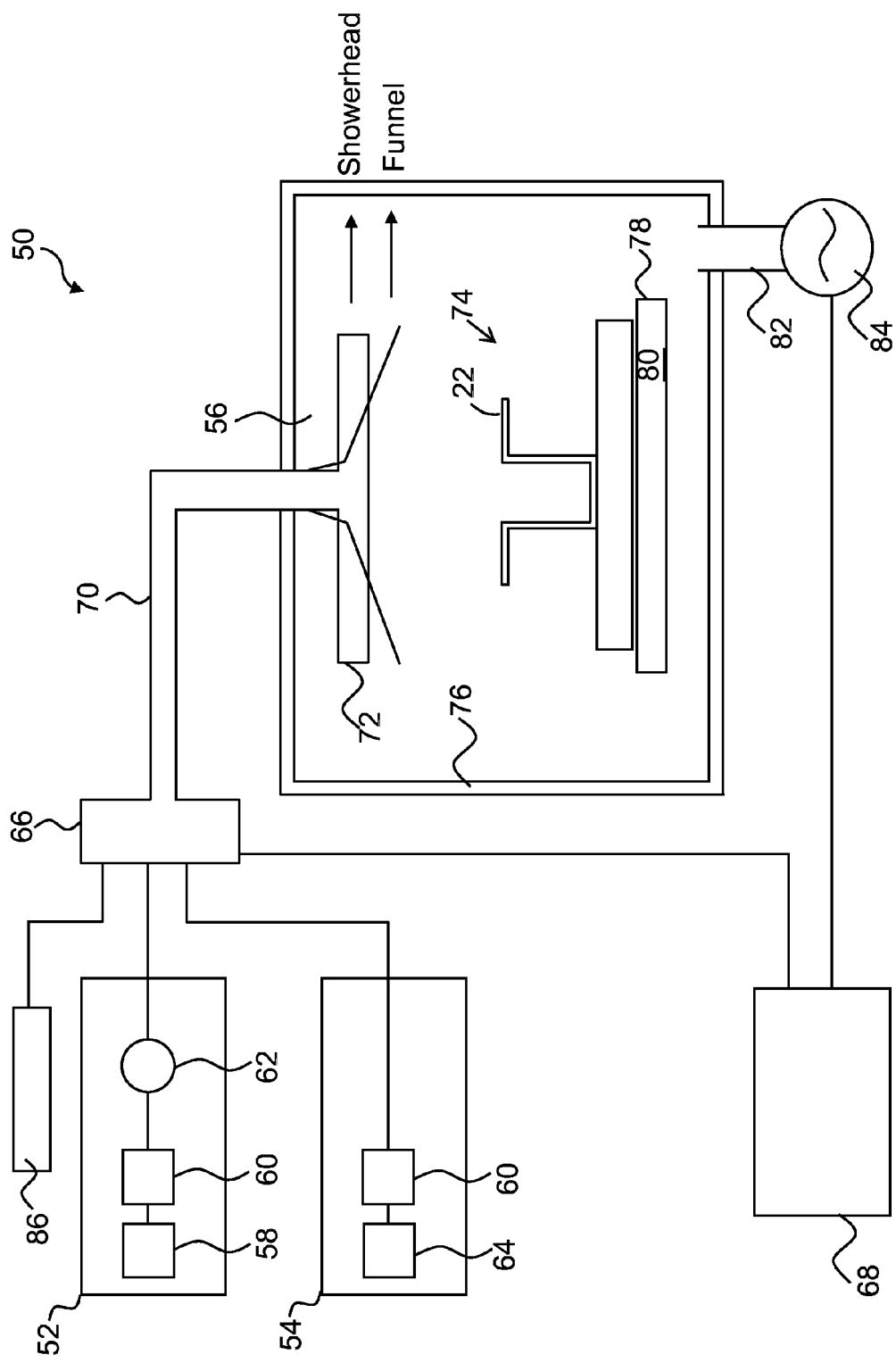
FIG. 3 illustrates a deposition system that may be utilized to form the N work function metal layer in the gate stack of the FinFET of FIG. 1.

Referring now to FIG. 3, a deposition system 50 that may be utilized to form the N work function metal layer 32 in the gate stack 22 of the FinFET 10 of FIG. 1 is illustrated. In an embodiment, the deposition system 50 may receive precursor materials from a first precursor delivery system 52 and a second precursor delivery system 54. The formation of the N work function metal layer 32 may be performed in a deposition chamber 56 that receives the first precursor material and the second precursor material.

The first precursor delivery system 52 and the second precursor delivery system 54 may work in conjunction with one another to supply the various different precursor materials to the deposition chamber 56. In an embodiment, the first precursor delivery system 52 may include a carrier gas supply 58, a flow controller 60, and a precursor canister 62. The carrier gas supply 58 may supply a gas that may be used to help "carry" the precursor gas to the deposition chamber 56. The carrier gas may be an inert gas or other gas that does not react with the precursor material or other materials within the deposition system 50. For example, the carrier gas may be argon (Ar), helium (He), nitrogen ($N_2$), hydrogen ($H_2$), combinations of these, and so on, although any other suitable carrier gas may alternatively be utilized. The carrier gas supply 58 may be a vessel, such as a gas storage tank, that is located either locally to the deposition chamber 56 or else may be located remotely from the deposition chamber 56.

The carrier gas supply 58 may supply the desired carrier gas to the flow controller 60. The flow controller 60 may be utilized to control the flow of the carrier gas to the precursor canister 62 and, eventually, to the deposition chamber 56, thereby also helping to control the pressure within the deposition chamber 56. The flow controller 60 may be, for example, a proportional valve, a modulating valve, a needle valve, a pressure regulator, a mass flow controller, combinations of these, and so on.

The flow controller 60 may supply the controlled carrier gas to the precursor canister 62. The precursor canister 62 may be utilized to supply a desired precursor to the deposition chamber 56 by vaporizing or sublimating precursor materials that may be delivered in either a solid or liquid phase. The precursor canister 62 may have a vapor region into which precursor material is driven into a gaseous phase so that the carrier gas from the flow controller 60 may enter the precursor canister 62 and pick-up or carry the gaseous precursor material out of the precursor canister 62 and towards the deposition chamber 56.

The second precursor delivery system 54 may comprise components similar to the first precursor delivery system 52. Indeed, the second precursor delivery system 54 may comprise a second precursor material supplier 64, such as a gas storage tank or a machine to generate the second precursor material on an as-needed basis. The second precursor material supplier 64 may supply a stream of the second precursor material to, for example, a flow controller 60 similar to the flow controller described above with respect to the first precursor delivery system 52.

The flow controller 60 in the second precursor delivery system 54 may help control the flow of the second precursor material to the precursor gas controller 66, and may be, for example, a proportional valve, a modulating valve, a needle vale, a pressure regulator, a mass flow controller, a combination of these, or the like, although any other suitable method of controlling the flow of the second precursor material may alternatively be utilized. While not shown in FIG. 3, the second precursory delivery system 207 may also include a precursor canister similar to precursor canister 62 of the first precursor delivery system 52.

The first precursor delivery system 52 and the second precursor delivery system 54 may supply their individual precursor materials into a precursor gas controller 66 that connects and isolates the first precursor delivery system 52 and the second precursor delivery system 54 from the deposition chamber 56 in order to deliver the desired precursor material to the deposition chamber 56. The precursor gas controller 66 may include such devices as valves, flow meters, sensors, and the like to control the delivery rates of each of the precursors, and may be controlled by instructions received from a control unit 68.

The precursor gas controller 66, upon receiving instructions from the control unit 68, may open and close valves so as to connect one of the first precursor delivery system 52 and the second precursor delivery system 54 to the deposition chamber 56. Such action directs a desired precursor material through a manifold 70, into the deposition chamber 56, and to a gas dispenser 72, which could be a funnel or a showerhead (which are each shown in FIG. 3). The gas dispenser 72 may be utilized to disperse the chosen precursor material into the deposition chamber 56 and may be designed to evenly disperse the precursor material in order to minimize undesired process conditions that may arise from uneven dispersal. In an embodiment, the gas dispenser 72 has a circular design with openings dispersed evenly to allow for the dispersal of the desired precursor material into the deposition chamber 56.

The deposition chamber 56 may receive the desired precursor materials and expose the precursor materials to a wafer 74 having a plurality of FinFETs with a partially formed gate stack 22 thereon. The deposition chamber 56 may be any desired shape that may be suitable for dispersing the precursor materials and contacting the precursor materials with the partially formed gate stack 22. In an embodiment, the deposition chamber 56 has a cylindrical sidewall and corresponding circular bottom. Furthermore, the deposition chamber 56 may be surrounded by a housing 76 made of material that is inert to the various process materials. In an embodiment, the housing 76 may be steel, stainless steel, nickel, aluminum, alloys of these, or combinations of these.

Within the deposition chamber 56 the wafer 74 may be placed on a pedestal 78 (or other mounting platform) in order to position and control the wafer 74 during the deposition process. The pedestal 221 may include a heater 80 or other heating mechanism in order to heat the wafer 74 during the deposition process. In an embodiment, the heater 80 in the pedestal 78 is spaced apart from the gas dispenser 72 (i.e., the funnel or the showerhead) by about 50 mils to 150 mils. While a single pedestal 78 is illustrated in FIG. 3, any number of pedestals 78 or mounting structures (with or without heaters) may additionally be included within the deposition chamber 56.

The deposition chamber 56 may also have an exhaust outlet 82 for exhaust gases to exit the deposition chamber 56. For example, an argon (Ar) purge gas may be removed from the deposition chamber 56 through the exhaust outlet 82. A vacuum pump 84 may be connected to the exhaust outlet 82 of the deposition chamber 56 in order to help evacuate the exhaust gases. The vacuum pump 84, under control of the control unit 68, may also be utilized to reduce and control the pressure within the deposition chamber 56 to a desired pressure. In an embodiment, the pressure within the deposition chamber 56 is maintained at about 2 Torr and about 5 Torr. The vacuum pump 84 may also be utilized to evacuate one precursor material from the deposition chamber 56 in preparation for the introduction of the next precursor material.

After the self-limiting reactions have finished, the deposition chamber 56 may be purged of the precursor material therein. For example, the control unit 68 may instruct the precursor gas controller 66 to disconnect the first precursor delivery system 52 (containing the first precursor material to be purged from the deposition chamber 56) and to connect a purge gas delivery system 86 to deliver a purge gas to the deposition chamber 56. In an embodiment the purge gas delivery system 86 may be a gaseous tank or other facility that provides a purge gas such as argon (Ar), nitrogen ($N_2$), xenon (Xe), or other non-reactive gas to the deposition chamber 56. Additionally, the control unit 68 may also initiate the vacuum pump 84 in order to apply a pressure differential to the deposition chamber 56 to aid in the removal of the first precursor material.

Figure 4:
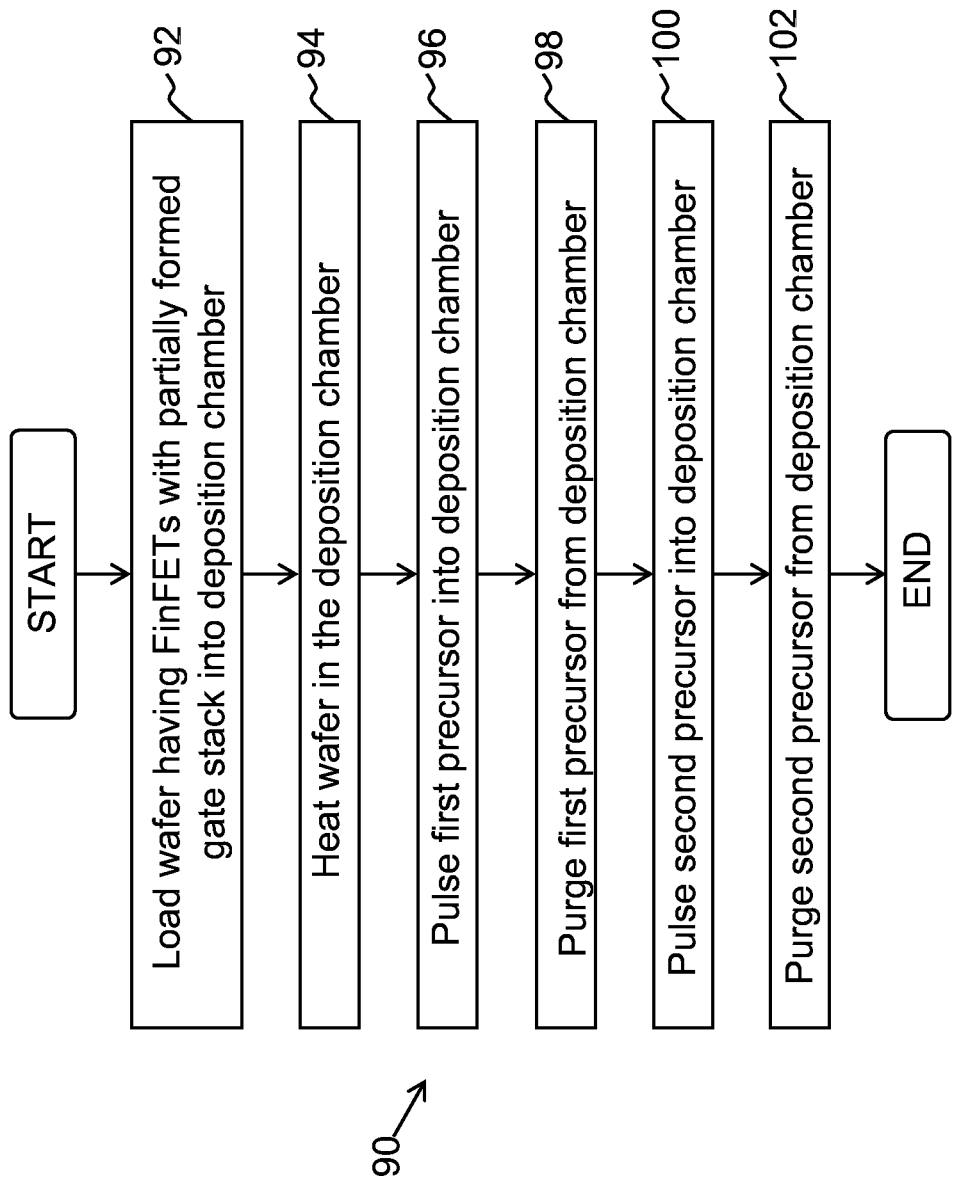
FIG. 4 illustrates an embodiment method of forming N work function metal layer in the gate stack of the FinFET of FIG. 1.

The deposition system 50 of FIG. 3 may be utilized to form the N work function metal layer 32 in the gate stack 22 of the FinFET 10 of FIG. 1 through an atomic layer deposition (ALD) process. Referring now to FIG. 4, an embodiment method 90 of forming the gate stack 22 for the FinFET 10 is illustrated. In block 92, the wafer 74 (which has a plurality of FinFETs each with a partially formed gate stack 22) is loaded into the deposition chamber 56. Thereafter, in block 94, the wafer 74 is heated using the heater 80 in the pedestal 78. In an embodiment, the wafer 74 is heated to a temperature of between about 350 degrees Celsius to about 450 degrees Celsius.

In block 96, a first precursor of a tantalum pentachloride ($TaCl_5$) is introduced or pulsed into the deposition chamber 56. In an embodiment, the first precursor is pulsed for between about 5 second to about 20 seconds. Even so, the first precursor may be pulsed for a longer or short time period. In an embodiment, the first precursor is transported to the deposition chamber 56 using an argon (Ar) carrier gas with a flow rate of between about 500 standard cubic centimeters per minute (sccm) and about 1500 sccm. In an embodiment, the first precursor may be pulsed at about 70 degrees Celsius to about 100 degrees Celsius. Even so, the first precursor may be pulsed with another suitable flow rate and another suitable temperature.

In block 98, the first precursor of the tantalum pentachloride ($TaCl_5$) is purged from the atomic layer deposition chamber. In an embodiment, the first precursor is purged for between about 2 second to about 10 seconds. Even so, the first precursor may be purged for a longer or short time period. In an embodiment, the first precursor is purged from the deposition chamber 56 using an argon (Ar) purge gas with a flow rate of between about 2500 standard cubic centimeters per minute (sccm) and about 3500 sccm. Even so, the first precursor may be purged using another suitable gas with another suitable flow rate.

In block 100, a second precursor of triethylaluminum (Al$(C_2H_5)_3$) is introduced or pulsed into the deposition chamber 56. In an embodiment, the second precursor is pulsed for between about 5 second to about 20 seconds. Even so, the second precursor may be pulsed for a longer or short time period. In an embodiment, the second precursor is transported to the deposition chamber 56 using an argon (Ar) carrier gas with a flow rate of between about 500 standard cubic centimeters per minute (sccm) and about 1500 sccm. In an embodiment, the second precursor may be pulsed at about 25 degrees Celsius to about 45 degrees Celsius. Even so, the second precursor may be pulsed with another suitable flow rate and another suitable temperature.

In block 102, the second precursor of the triethylaluminum (Al$(C_2H_5)_3$) is purged from the deposition chamber 56. In an embodiment, the second precursor is purged for between about 2 second to about 10 seconds. Even so, the second precursor may be purged for a longer or short time period. In an embodiment, the first precursor is purged from the deposition chamber 56 using an argon (Ar) purge gas with a flow rate of between about 2500 standard cubic centimeters per minute (sccm) and about 3500 sccm. Even so, the second precursor may be purged using another suitable gas with another suitable flow rate.

With the second precursor purged, the N work function metal layer 32 for the gate stack 22 is generated after a suitable opportunity for oxidation. As noted above, the N work function metal layer 32 has oxidation layers 24 on opposing sides of the tantalum aluminide carbide (TaAlC) layer 36.

Referring now to FIG. 5, the process 104 of pulsing the first precursor 106, purging the first precursor 108, pulsing the second precursor 110, and then purging the second precursor 112 may be repeated to form additional monolayers of the tantalum aluminide carbide (TaAlC) layer 36. Indeed, the arrow of FIG. 5 illustrates that the alternative pulsing/purging process, as described in detail above, may be repeated. Once a suitable number of monolayers of the tantalum aluminide carbide (TaAlC) layer 36 have been formed (e.g., nine layers, eleven layers, fifteen layers, and so on), the tantalum aluminide carbide (TaAlC) layer 36 may be exposed to oxygen to permit oxidation to occur.

Referring now to FIG. 6, two different reaction models 114 are shown. Both TaC and TaAlC are formed in the reaction. However, at higher temperature the second reaction is more pronounced and more tantalum aluminide carbide (TaAlC) is formed. Thus, work function tuning can be achieved by tuning of process temperature effectively.

Figures 7, 8:
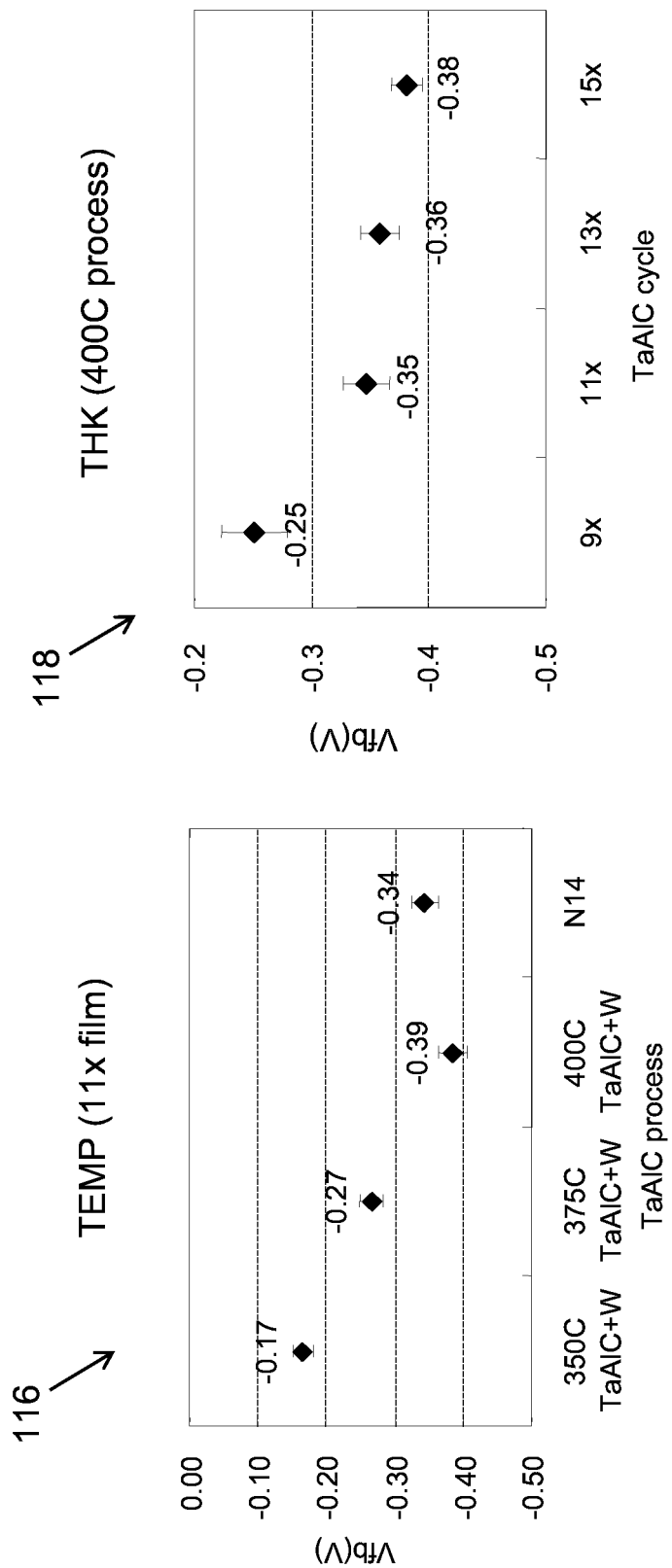
FIG. 7 is a chart illustrating the effect of temperature on a flat band voltage ($V_{fb}$) for a FinFET having an N work function metal layer formed from eleven monolayers.
FIG. 8 is a chart illustrating the effect of thickness of the N work function metal layer.

Referring now to FIG. 7, a chart 116 illustrating the effect of temperature on a flat band voltage ($V_{fb}$) for a MOS capacitor having an N work function metal layer formed from eleven monolayers is provided. As shown, the flat band voltage changes from about −0.17 V to about −0.39 V as the temperature is increased from about 350° C. to about 400° C. when the N work function metal layer includes tantalum aluminide carbide (TaAlC) and a metal fill layer of tungsten (W) is used. For the purpose of reference, the chart 116 also includes the flat band voltage for a FinFET with the N work function metal layer of tantalum aluminide carbide (TaAlC) and a metal fill layer of aluminum (Al), which is labeled as N14 in the chart 116.

Referring now to FIG. 8, a chart 118 illustrating the effect of thickness of the N work function metal layer is provided. As shown, the flat band voltage changes from about −0.25 V to about −0.38 V as the thickness of the N work function metal layer changes from 9 monolayers (9×) to about 15 monolayers (15×). Notably, the comparison of the flat band voltages at various thicknesses is made with a process temperature of about 400° C.

Figure 9:
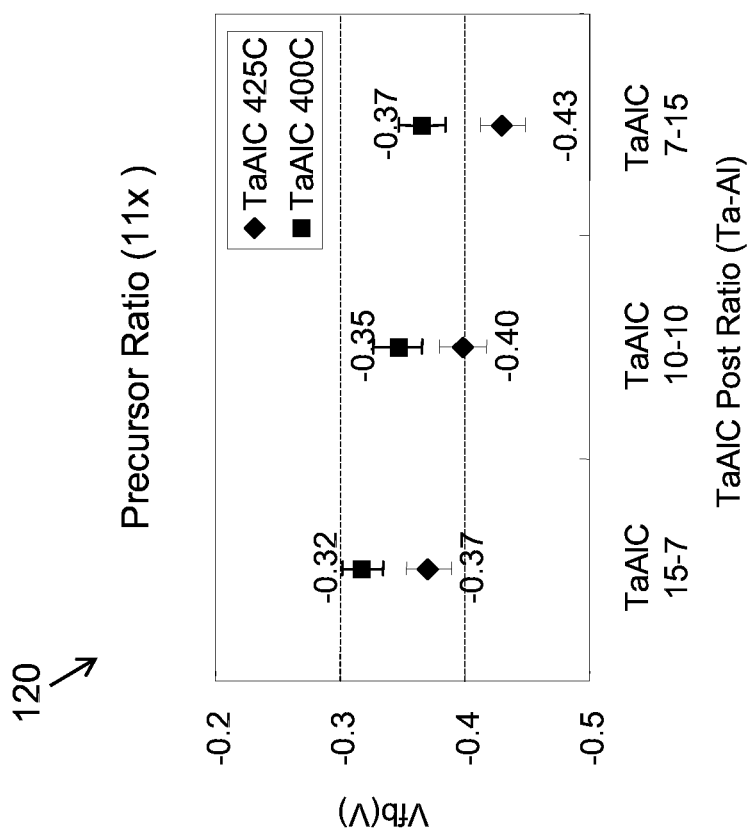
FIG. 9 is a chart illustrating the effect of a precursor ratio on a flat band voltage ($V_{fb}$) for a FinFET having an N work function metal layer formed from eleven monolayers.

Referring now to FIG. 9, a chart 120 illustrating the effect of a precursor ratio on a flat band voltage ($V_{fb}$) for a FinFET having an N work function metal layer formed from eleven monolayers is provided. As shown, the flat band voltage has a range of about −0.32 V to about −0.37 V when the ratio of tantalum pentachloride ($TaCl_5$) to triethylaluminum (Al($C_2H_5$)$_3$) used to form the aluminide carbide (TaAlC) layer of the N work function metal layer 32 is about 15 to 7. In addition, the flat band voltage has a range of about −0.35 V to about −0.40 V when the ratio of tantalum pentachloride ($TaCl_5$) to triethylaluminum (Al($C_2H_5$)$_3$) is about 10 to 10. The flat band voltage has a range of about −0.37 V to about −0.43 V when the ratio of tantalum pentachloride ($TaCl_5$) to triethylaluminum (Al($C_2H_5$)$_3$) is about 7 to 15.

Referring now to FIG. 10, a chart 122 depicting various parameters used for the tantalum aluminide carbide (TaAlC) layer 36 composition is provided. As shown, the chart includes temperature ranges, precursor ratios (labeled as the "condition"), the percentage of oxygen, the percentage of aluminum, the percentage of chlorine, the percentage of tantalum, and the percentage of carbon. For reference, the percentages of aluminum, tantalum, and carbon have been highlighted.

An embodiment fin field effect transistor (FinFET) including a fin supported by a semiconductor substrate, the fin extending between a source and a drain and having a channel region, and a gate stack formed over the channel region of the fin, the gate stack including an N work function metal layer comprising an oxidation layer on opposing sides of a tantalum aluminide carbide (TaAlC) layer.

An embodiment method of forming a gate stack for a fin field effect transistor (FinFET) including heating a wafer having the FinFET in an atomic layer deposition chamber, pulsing a first precursor of a tantalum pentachloride ($TaCl_5$) into the atomic layer deposition chamber with the wafer having the FinFET, purging the first precursor of the tantalum pentachloride ($TaCl_5$) from the atomic layer deposition chamber, pulsing a second precursor of triethylaluminum (Al($C_2H_5$)$_3$) into the atomic layer deposition chamber with the wafer having the FinFET, and purging the second precursor of the triethylaluminum (Al($C_2H_5$)$_3$) from the atomic layer deposition chamber with the wafer having the FinFET to generate an N work function metal layer for the gate stack, the N work function metal layer comprising a tantalum aluminide carbide (TaAlC) layer with an oxidation layer on opposing sides thereof.

An embodiment N metal work function composition for a gate stack of a fin field effect transistor (FinFET) including aluminum in a range of between about 16% to about 25%, carbon in a range of between about 20% to about 29%, tantalum in a range of between about 9% to about 16%, and oxygen in a range of between about 35% to about 50%.

In an embodiment, a method of forming a gate stack is provided. The method includes heating a wafer in an atomic layer deposition chamber and pulsing a first precursor of a tantalum pentachloride ($TaCl_5$) into the atomic layer deposition chamber with the wafer. The first precursor of the tantalum pentachloride ($TaCl_5$) is purged from the atomic layer deposition chamber, and a second precursor of triethylaluminum (Al($C_2H_5$)$_3$) is pulsed into the atomic layer deposition chamber with the wafer. The second precursor of the triethylaluminum (Al($C_2H_5$)$_3$) is purged from the atomic layer deposition chamber with the wafer to generate a tantalum aluminide carbide (TaAlC) layer. Opposing sides of TaAlC layer is oxidized, thereby forming a first TaAlCO layer, a TaAlC layer over the first TaAlCO layer, and a second TaAlCO layer over the TaAlC layer. One or more layers of a metal gate electrode is formed over the second TaAlCO layer.

In another embodiment, a method of forming a gate stack is provided. The method includes forming a gate dielectric over a channel region, forming an N forming an N metal work function layer over the gate dielectric, and forming a metal layer over the N metal work function layer. The N metal work function layer includes a first TaAlCO material layer, a TaAlC layer over the first TaAlCO material layer, and a second TaAlCO material layer over the TaAlC layer. The first TaAlCO layer includes aluminum in a range of between about 16% to about 25%, carbon in a range of between about 20% to about 29%, tantalum in a range of between about 9% to about 16%, and oxygen in a range of between about 35% to about 50%.

In another embodiment, a method of forming a gate stack is provided. The method includes forming a dielectric layer along sidewalls of spacers and a surface of a substrate. A TaAlC layer is formed over the dielectric layer, and a first TaAlCO layer and a second TaAlCO layer on are formed on opposing sides of the TaAlC layer such that the first TaAlCO layer is interposed between the TaAlC layer and the dielectric layer. A metal layer is formed over the second TaAlCO layer.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming a gate stack, the method comprising:
heating a wafer in an atomic layer deposition chamber;
pulsing a first precursor comprising tantalum pentachloride ($TaCl_5$) into the atomic layer deposition chamber with the wafer;
purging the first precursor comprising tantalum pentachloride ($TaCl_5$) from the atomic layer deposition chamber;
pulsing a second precursor comprising triethylaluminum ($Al(C_2H_5)_3$) into the atomic layer deposition chamber with the wafer;
purging the second precursor comprising triethylaluminum ($Al(C_2H_5)_3$) from the atomic layer deposition chamber with the wafer to generate a tantalum aluminide carbide (TaAlC) layer;
oxidizing opposing sides of TaAlC layer, thereby forming a first TaAlCO layer, a TaAlC layer over the first TaAlCO layer, and a second TaAlCO layer over the TaAlC layer; and
forming one or more layers over the second TaAlCO layer, the one or more layers including a metal gate electrode layer.

2. The method of claim 1, wherein heating the wafer comprises heating the wafer to a temperature between about 350 degrees Celsius to about 450 degrees Celsius.

3. The method of claim 1, wherein at least one of pulsing the first precursor and pulsing the second precursor comprises pulsing for about 5 seconds to about 20 seconds.

4. The method of claim 1, wherein at least one of purging the first precursor and purging the second precursor comprises purging for about 2 seconds to about 10 seconds.

5. The method of claim 1, further comprising transporting at least one of the first precursor and the second precursor to the atomic layer deposition chamber using an argon carrier gas with a flow rate of between about 500 standard cubic centimeters per minute (sccm) and about 1500 sccm.

6. The method of claim 1, wherein at least one of purging the first precursor and purging the second precursor comprises using an argon purge gas with a flow rate of between about 2500 standard cubic centimeters per minute (sccm) and about 3500 sccm.

7. The method of claim 1, wherein pulsing the first precursor into the atomic layer deposition chamber is performed at about 70 degrees Celsius to about 100 degrees Celsius.

8. The method of claim 1, wherein pulsing the second precursor into the atomic layer deposition chamber is performed at about 25 degrees Celsius to about 45 degrees Celsius.

9. The method of claim 1, further comprising maintaining a pressure of between about 2 Torr and about 5 Torr in the atomic layer deposition chamber.

10. The method of claim 1, further comprising supporting the wafer with a pedestal having a heater used to heat the wafer, pulsing the first and second precursor into the atomic layer deposition chamber with a gas dispenser, and spacing the heater about 50 mils to about 150 mils from the gas dispenser.

11. A method of forming a gate stack, the method comprising:
forming a gate dielectric over a channel region;
forming an N metal work function layer over the gate dielectric, the N metal work function layer comprising:
a first TaAlCO material layer, the first TaAlCO layer comprising:
aluminum in a range of between about 16% to about 25%;
carbon in a range of between about 20% to about 29%;
tantalum in a range of between about 9% to about 16%; and
oxygen in a range of between about 35% to about 50%;
a TaAlC layer over the first TaAlCO material layer; and
a second TaAlCO material layer over the TaAlC layer; and
forming a metal layer over the N metal work function layer.

12. The method of claim 11, further comprising forming a dielectric cap layer over the gate dielectric, the N metal work function layer being formed over the dielectric cap layer.

13. The method of claim 12, wherein the dielectric cap layer comprises TiN.

14. The method of claim 12, further comprising forming an etch stop layer over the dielectric cap layer.

15. The method of claim 14, wherein the etch stop layer comprises TaN.

16. The method of claim 11, wherein the N metal work function layer has a U-shape.

17. A method of forming a gate stack, the method comprising:
forming a dielectric layer along sidewalls of spacers and a surface of a substrate;
forming a TaAlC layer over the dielectric layer;
forming a first TaAlCO layer and a second TaAlCO layer on opposing sides of the TaAlC layer, the first TaAlCO layer being interposed between the TaAlC layer and the dielectric layer; and
forming a metal layer over the second TaAlCO layer.

18. The method of claim 17, wherein the forming the TaAlC layer comprises:
heating the substrate in an atomic layer deposition chamber;
pulsing a first precursor comprising tantalum pentachloride ($TaCl_5$) into the atomic layer deposition chamber with the substrate;
purging the first precursor comprising tantalum pentachloride ($TaCl_5$) from the atomic layer deposition chamber;
pulsing a second precursor comprising triethylaluminum ($Al(C_2H_5)_3$) into the atomic layer deposition chamber with the substrate; and
purging the second precursor comprising triethylaluminum ($Al(C_2H_5)_3$) from the atomic layer deposition chamber with the substrate to generate a tantalum aluminide carbide (TaAlC) layer.

19. The method of claim 17, wherein the first TaAlCO layer comprises:
aluminum in a range of between about 16% to about 25%;
carbon in a range of between about 20% to about 29%;
tantalum in a range of between about 9% to about 16%; and
oxygen in a range of between about 35% to about 50%.

20. The method of claim 17, further comprising forming a dielectric cap layer interposed between the dielectric layer and the first TaAlCo layer, the dielectric cap layer comprising TiN.

* * * * *